United States Patent
Wolf et al.

(10) Patent No.: US 10,741,995 B2
(45) Date of Patent: Aug. 11, 2020

(54) OPTICAL AND OPTOELECTRONIC ASSEMBLY AND METHOD FOR THE PRODUCTION THEREOF

(71) Applicant: JENOPTIK Optical Systems GmbH, Jena (DE)

(72) Inventors: Juergen Wolf, Schloeben (DE); Annelies Hirsch, Jena (DE)

(73) Assignee: JENOPTIK Optical Systems GmbH, Jena (DE)

( * ) Notice: Subject to any disclaimer, the term of this patent is extended or adjusted under 35 U.S.C. 154(b) by 0 days.

(21) Appl. No.: 16/337,094

(22) PCT Filed: Sep. 25, 2017

(86) PCT No.: PCT/EP2017/074223
§ 371 (c)(1),
(2) Date: Mar. 27, 2019

(87) PCT Pub. No.: WO2018/060134
PCT Pub. Date: Apr. 5, 2018

(65) Prior Publication Data
US 2020/0036159 A1   Jan. 30, 2020

(30) Foreign Application Priority Data
Sep. 27, 2016   (DE) .................. 10 2016 218 522

(51) Int. Cl.
*H01S 5/024* (2006.01)
*B33Y 80/00* (2015.01)
(Continued)

(52) U.S. Cl.
CPC ........ *H01S 5/02423* (2013.01); *B22F 3/1055* (2013.01); *B33Y 80/00* (2014.12);
(Continued)

(58) Field of Classification Search
CPC .. H01S 5/024; H01S 5/02407; H01S 5/02469; H01S 5/02476–02492;
(Continued)

(56) References Cited

U.S. PATENT DOCUMENTS

| | | |
|---|---|---|
| 5,008,737 A | 4/1991 | Burnham et al. |
| 5,105,429 A | 4/1992 | Mundinger et al. |

(Continued)

FOREIGN PATENT DOCUMENTS

| | | |
|---|---|---|
| DE | 19 50 691 U | 12/1966 |
| DE | 43 15 580 A1 | 11/1994 |

(Continued)

OTHER PUBLICATIONS

Harnagel G L et al, "Large Laser Diode Arrays for High-Duty-Cycle Operation", Electronics Letters, IEE Stevenage, GB, vol. 28, No. 18, Aug. 27, 1992, pp. 1702-1704, ISSN: 0013-5194.

*Primary Examiner* — Joshua King
(74) *Attorney, Agent, or Firm* — Muncy, Geissler, Olds & Lowe, P.C.

(57) ABSTRACT

The invention relates to the production of an optical or optoelectronic assembly (1, 2) comprising an active component (5) and a cooler (3). The cooler (3) is produced by means of a 3D printing method on a composite plate (6).

15 Claims, 4 Drawing Sheets

(51) Int. Cl.
  *H01L 33/64* (2010.01)
  *H01S 5/40* (2006.01)
  *B33Y 10/00* (2015.01)
  *B33Y 70/00* (2020.01)
  *B22F 3/105* (2006.01)
  *H01L 21/48* (2006.01)

(52) U.S. Cl.
  CPC .......... *H01L 33/644* (2013.01); *H01L 33/648* (2013.01); *H01S 5/02476* (2013.01); *H01S 5/4025* (2013.01); *B33Y 10/00* (2014.12); *B33Y 70/00* (2014.12); *H01L 21/4871* (2013.01); *H01L 2933/0075* (2013.01); *H01S 5/4018* (2013.01)

(58) Field of Classification Search
  CPC ............. H01S 5/02423; H01S 5/02256; H01S 5/0226; H01S 5/02272; H01L 33/648; H01L 23/473–4735; H01L 2933/0075; H01L 21/4871; H01L 21/7882; B22F 5/10; Y02P 10/295; B33Y 80/00; B33Y 10/00; B33Y 30/00; B33Y 70/00–10; B33Y 40/00–20
  See application file for complete search history.

(56) References Cited

U.S. PATENT DOCUMENTS

| | | | |
|---|---|---|---|
| 5,523,049 A | 6/1996 | Terpstra et al. | |
| 6,600,763 B2 | 7/2003 | Ludewigt | |
| 8,198,539 B2* | 6/2012 | Otoshi | H01L 23/367 165/104.33 |
| 9,083,138 B2 | 7/2015 | Ebert | |
| 9,299,636 B2 | 3/2016 | Terao et al. | |
| 9,536,806 B2 | 1/2017 | Ebert et al. | |
| 10,490,482 B1* | 11/2019 | Joshi | H01L 23/3677 |
| 2004/0082112 A1* | 4/2004 | Stephens | H01S 5/02423 438/122 |
| 2005/0168950 A1 | 8/2005 | Yoshioka et al. | |
| 2006/0067373 A1 | 3/2006 | Alander | |
| 2008/0149304 A1* | 6/2008 | Slaughter | H01L 23/367 165/80.2 |
| 2009/0139704 A1* | 6/2009 | Otoshi | H05K 3/0061 165/185 |
| 2010/0314072 A1* | 12/2010 | Lee | H01L 23/3735 165/80.2 |
| 2016/0043066 A1* | 2/2016 | Funabashi | H01L 23/427 257/192 |
| 2016/0118766 A1* | 4/2016 | Killi | H01S 3/042 372/35 |
| 2017/0082371 A1* | 3/2017 | Vos | B23P 15/26 |
| 2017/0082372 A1* | 3/2017 | Vos | F28D 20/02 |
| 2017/0250122 A1* | 8/2017 | Hamweendo | F28F 3/12 |

FOREIGN PATENT DOCUMENTS

| | | | | |
|---|---|---|---|---|
| DE | 199 39 774 A1 | 3/2001 | | |
| DE | 10 2007 051 796 A1 | 5/2009 | | |
| DE | 10 2014 201 306 A1 | 7/2015 | | |
| DE | 10 2015 007 791 A1 | 12/2016 | | |
| DE | 102017221778 A1 * | 6/2019 | ........... | B22F 3/1055 |
| EP | 0 364 155 A2 | 4/1990 | | |
| EP | 1 672 690 A1 | 6/2006 | | |
| FR | 3060940 A1 * | 6/2018 | ............... | B22F 7/06 |
| GB | 2419463 A * | 4/2006 | ........... | F28F 13/003 |
| GB | 2549499 A * | 10/2017 | ........... | B22F 3/1055 |
| JP | 2004-186212 A | 7/2004 | | |
| WO | WO 96/13350 A1 | 5/1996 | | |
| WO | WO 2009/062732 A2 | 5/2009 | | |
| WO | WO 2011/040044 A1 | 4/2011 | | |

\* cited by examiner

OPTICAL AND OPTOELECTRONIC ASSEMBLY AND METHOD FOR THE PRODUCTION THEREOF

This nonprovisional application is a National Stage of International Application No. PCT/EP2017/074223, which was filed on Sep. 25, 2017, and which claims priority to German Patent Application No. 10 2016 218 522.5, which was filed in Germany on Sep. 27, 2016, and which are both herein incorporated by reference.

BACKGROUND OF THE INVENTION

Field of the Invention

The present invention relates to the production of an optical or optoelectronic assembly using a 3D printing method. The assembly comprises an optical or optoelectronic component, which is intended to be cooled during operation, and a cooler.

Description of the Background Art

EP1672690A1 discloses a microchannel cooler for a laser bar, and the production of same by selective laser melting of a metal powder. What is disadvantageous is that the mounting surface for the component is in electrical contact with the heat sink. If it is necessary for the component to be electrically insulated from the heat sink, an insulating intermediate layer has to be provided, which has the disadvantage that the heat transfer is poorer owing to additional interface layers. WO 2009/062732A2 discloses the production of similar microchannel coolers with different metal powders being used in combination.

WO 2011/040044A1 discloses producing a cooler by rolling a sintered metal film onto a different metallic layer and thereby constructing a laminate body.

DE 195 06 91A 1 discloses producing a cooling element for electrical circuits by stacking layers connected to one another in a planar fashion. What is disadvantageous is that there are limitations in the structural design of the coolers, and the production of the coolers is costly and complex. Coolers constructed layer by layer for laser bars with the same disadvantages are also known from DE4315580A1.

WO96/013350 A1 discloses producing a cooler by providing metal powders with an organic binder, pressing the cooler to shape and then evaporating the binder and bonding the powder particles. What is disadvantageous is that the cooler can have a leak rate, and there is a lack of electrical insulation.

DE 199 39 774 A1 discloses cooling a laser disk on the rear side directly using a coolant jet. In this case, the laser disk can become wet and, moreover, the coolant jet can have an abrasive effect, which can adversely affect the lifetime.

DE102014201306A1 discloses a production method for a power electronic module in which a cooler structure is applied to a power electronic component. What is disadvantageous is that the power electronic component is subjected to the loads during the process of producing the cooler structure.

DE102015007791A1 has disclosed the production of a heat sink by means of an additive manufacturing method. Said publication proposes forming the heat sink by placing the laser source into a metal powder bed and bonding the metal powder to a metal layer situated on the laser source with the aid of an installation laser. What is disadvantageous is that there is the risk of the laser source being damaged in the process.

SUMMARY OF THE INVENTION

One object of the invention is to specify a simple and cost-effective production method for an optical or optoelectronic assembly. The assembly is intended to ensure the best possible cooling of the optical or optoelectronic component. In this case, the optical or optoelectronic component is to be protected against severe thermal and mechanical loads. A further object is to specify an optical or electrooptical assembly in which an optical or electrooptical component can be cooled particularly efficiently.

The method according to the invention allows the cost-effective production of an optical or optoelectronic assembly. The finished assembly has numerous advantages. The component to be cooled can be mounted in a manner electrically insulated from the cooler structure. As a result, the coolant can be electrically insulated from the component to be cooled, without additional insulation layers being required. The number of interface layers adversely affecting the heat transfer is minimized. A multiplicity of assemblies can be manufactured in parallel in the panel. In the case of the embodiment with such a laser component which comprises a plurality of laser bars, it is particularly advantageous that the individual laser bars can be insulated from one another, without additional insulation layers having to be used. The heat sink can be produced at a high temperature; the process proceeds rapidly as a result.

The object is achieved by means of a method for producing an optical or optoelectronic assembly, comprising providing a composite plate, wherein the composite plate comprises at least one first nonmetallic layer and a first metallic layer and a second metallic layer, subdividing the second metallic layer into a plurality of second regions, providing a start surface on the first metallic layer, producing a cooler structure on the start surface by selectively melting and/or by selectively sintering at least one first material, providing an optical or optoelectronic component, wherein the component comprises at least one optically pumped laser disk or at least one diode laser bar or at least one light emitting diode (LED), securing the component on a mounting surface arranged on the second metallic layer, wherein securing the component is carried out after producing the cooler structure and the component covers a plurality of second regions of the second metallic layer.

The object is achieved by means of an optical or optoelectronic assembly comprising a cooler and an optical or optoelectronic component, wherein the cooler comprises a composite plate, wherein the composite plate comprises at least one first nonmetallic layer and a first metallic layer and a second metallic layer, wherein the second metallic layer is subdivided into a plurality of second regions, wherein the composite plate comprises a start surface on the first metallic layer, b) a cooler structure produced on the start surface by a 3D printing method and composed of a first material comprising a metal, c) a mounting surface for the component, said mounting surface being arranged on the second metallic layer, wherein the component is secured on the mounting surface and the component covers a plurality of second regions of the second metallic layer.

The invention includes a method for producing an optical or optoelectronic assembly. An optical assembly can be understood to mean an assembly comprising an active optical component. An active optical component can be such a component which is provided for emitting a secondary light radiation and in so doing taking up energy in the form of a primary light radiation during operation. The primary and/or the secondary light radiation can be laser light. The primary light radiation can be referred to as pump light. The active optical component can thus be optically pumped. Such a component can develop waste heat during operation. Therefore, there may be the need to cool said component. An optical component can be an optical amplifier element, for example a laser crystal disk or a semiconductor laser disk, provided for optically pumped operation. An optoelectronic assembly can be understood to mean an assembly comprising an active optoelectronic component, which can develop waste heat during operation, and there may therefore be the need to cool said component. An optoelectronic component can comprise an element which converts electrical energy into a light radiation on the basis of a semiconductor material, for example a light emitting diode (LED) or a laser diode. To put it another way, the optoelectronic component can be such a component which emits a (secondary) light radiation and is electrically pumped for this purpose during operation. Said light radiation can arise as a result of spontaneous emission; in this case, the optoelectronic component can be referred to as an LED component. The light radiation can alternatively arise as a result of stimulated emission; the optoelectronic component can then be referred to as a laser component. The optoelectronic component can also comprise a plurality of optoelectronic elements.

In order to carry out the method, it is necessary to provide a composite plate. The composite plate is embodied in a multilayered fashion, wherein the composite plate comprises at least one first nonmetallic layer and a first metallic layer and a second metallic layer. Furthermore, the composite plate can comprise further nonmetallic layers and/or further metallic layers. However, the use of a composite plate comprising only a single nonmetallic layer can be particularly advantageous. The first metallic layer and the second metallic layer can be arranged on the opposite sides of the first nonmetallic layer. As a result, the second metallic layer can be electrically insulated from the first metallic layer. In each case a fixed planar connection of the first metallic layer and of the second metallic layer to the first nonmetallic layer is advantageous. It is thereby possible to establish the heat transfer between the layers. The composite plate can comprise for example a ceramic plate having a respective metallic layer on both sides. Such a plate can be produced by applying a respective metallic layer on each of the two sides of a ceramic baseplate. Such layers can be produced electrolytically in a known manner or be produced by the known DCB (direct copper bonding) method. By way of example, a commercially available DCB plate (DCB substrate) can be used as the composite plate. A DCB plate can comprise, as first nonmetallic layer, for example, a ceramic carrier plate having a thickness of between 0.25 mm and 2 mm. The latter can consist of $Al_2O_3$, AlN or SiC, for example. The composite plate can comprise a respective metallic layer on both sides, which metallic layer can be configured in each case as a metal layer, for example as a Cu or an Ag layer having a thickness of between 0.025 mm and 0.5 mm. Without restricting the generality, it is possible hereinafter to choose an orthogonal coordinate system xyz in which the composite plate lies in an xz plane. In the method according to the invention, the second metallic layer is subdivided into a plurality of second regions. The second regions of the second metallic layer can be electrically insulated from one another after the subdividing. The subdividing can be carried out for example by trenches being introduced into the second metallic layer, which trenches can extend as far as the first nonmetallic layer. By way of example, known mask etching methods, mechanical removal methods or laser removal methods can be used for this purpose. As a result of subdividing the second metallic layer, the mounting surface defined below can be decomposed into a plurality of partial surfaces. Said partial surfaces can be the surfaces of the second regions mentioned.

The method according to the invention furthermore comprises providing a start surface on the first metallic layer. The start surface can be a contiguous surface. Alternatively, a non-contiguous surface can also be provided as start surface, which can arise for example as a result of subdividing the first metallic layer.

The method according to the invention additionally comprises producing a cooler structure on the start surface by selectively melting and/or by selectively sintering at least one first material.

Methods for selective sintering and/or for selective melting are known and are often referred to as 3D printing methods.

The method according to the invention furthermore comprises providing an optical or optoelectronic component, wherein the component can comprise at least one optically pumped laser disk or at least one diode laser bar or at least one light emitting diode (LED). An optical component can be for example a laser disk or a laser disk with a holding element. A laser disk can be a laser crystal disk, for example. A laser crystal disk can comprise a doping with a laser-active material, for example. A laser disk can alternatively be a semiconductor laser disk provided for being optically pumped during operation. The laser disk can have a normal direction −y, for example. The amplification of the laser radiation in the laser disk can take place in said normal direction and also in the opposite direction.

Hereinafter the term component is used if the statement is intended to be applicable both to an optical component and to an optoelectronic component. The method can be suitable in particular for a large-area component. A large-area component can be understood to mean a component having a basic area of 0.5 cm$^2$ or more. The area of a perpendicular projection of the component onto the xz plane can be understood as a measure of the basic area. The method according to the invention comprises securing the component on a mounting surface arranged on the second metallic layer. The mounting surface can comprise a plurality of partial surfaces that arise during the process of subdividing the second metallic layer. In the mathematical sense, the mounting surface can be a non-contiguous surface consisting of a plurality of partial surfaces. The optical or optoelectronic component covers a plurality of second regions of the second metallic layer. To put it another way, that can mean that in a section perpendicular to the plate plane xz of the composite plate, the component has a linear extent, measured parallel to the plate plane, which has a magnitude such that a plurality of second regions of the second metallic layer are covered. The component can thus extend over a plurality of second regions of the second metallic layer in at least one direction (z-direction) lying in the plane of the composite plate. One advantageous effect of this measure is that thermomechanical stresses of the component can be reduced in comparison with such an assembly in which the second metallic layer would not be subdivided into regions. Moreover, cavities between the component and the mounting surface can be avoided, for example by virtue of the fact that when joining the component to the mounting surface air bubbles can escape before the joining agent solidifies. In the case of an optoelectronic component it can additionally be advantageous that individual parts, for example heat-conducting bodies, of an optoelectronic component can be mounted on different second regions of the second metallic layer which are electrically insulated from one another. A reliable contacting of the optoelectronic component can be realized as a result. Securing the component to the mounting surface can be carried out using a joining agent. Advantageously, the joining agent can have a high thermal conductivity. Advantageously, a metallic solder can be used as joining agent.

The method according to the invention provides for securing the component to be carried out after producing the cooler structure. It is thereby possible to prevent the sensitive component from being subjected to thermal loads, mechanical loads and/or dust loading during the production of the cooling structure. On the other hand, the process for producing the cooler structure can be carried out at an elevated temperature above that at which the component exhibits thermal stability. As a result, the production of the heat sink can be carried out more rapidly.

The optical or optoelectronic assembly according to the invention comprises a cooler and an optical or optoelectronic component. The cooler comprises a composite plate, wherein the composite plate comprises at least one first nonmetallic layer and a first metallic layer and a second metallic layer, wherein the second metallic layer is subdivided into a plurality of second regions, wherein the composite plate comprises a start surface on the first metallic layer, b) a cooler structure produced on the start surface by a 3D printing method and composed of a first material comprising a metal, c) a mounting surface for the component, said mounting surface being arranged on the second metallic layer, wherein the component is secured on the mounting surface and the component covers a plurality of second regions of the second metallic layer.

Producing the cooler structure can involve supplying the first material in powder form. The first material can be supplied layer by layer. The selective melting and/or the selective sintering can be carried out layer by layer. Selective melting and/or sintering can mean that the first material is consolidated only at predetermined locations, while it is not consolidated at other locations. The melting and/or sintering can be performed using a laser beam. The first layer of the cooler structure can be produced directly on the start surface. The layer-by-layer growth of the cooler structure can take place in a growth direction y perpendicular to the plate plane xz. That is to say that the layers of the material application and/or sintering lie perpendicular to the direction y. After or even already during the production of the cooler structure, excess unconsolidated first material can be removed, for example by flushing out the cooler. The layer-by-layer selective melting and/or selective sintering of a material supplied in powder form can be a 3D printing method, which is particularly advantageous. Alternatively, other 3D printing methods can also be used. By way of example, the first material could be supplied in viscous form and be consolidated by means of a laser beam, for example.

The first metallic layer can consist of Cu, Ag, Ni, Au or Al or comprise one of the substances mentioned. Particularly advantageously, a material having a high thermal conductivity can be provided; the use of Ag or Cu can be particularly advantageous. Advantageously, the first metallic layer can consist of a relatively soft material, for example Cu. Mechanical stresses in the assembly can be reduced as a result. The first material can be Ag, Cu, Al, Ni, Cr, Mo, W or some other metal or comprise one of these metals. The use of a material having a high thermal conductivity can be advantageous, for example Cu or Ag. A high efficiency of the cooler structure can be achieved as a result. Alternatively, a material that can be better sintered can also be advantageous, for example Ni or Cr. Alternatively, a material that is then eroded more slowly in the coolant flow can also be advantageous, for example Mo, W, Ni or Cr. Advantageously, the first material can have a greater hardness than the first metallic layer. The Vickers hardness, for example, can be consulted for this purpose. What can be achieved as a result is that the cooler structure is eroded by the coolant flow more slowly than if the same material as for the first metallic layer were used as first material. The service life of the assembly can be increased as a result. The rate of erosion in the coolant flow can also be reduced by virtue of the first material being supplied as metal powder, for example Cu or Ag, with which a specific amount of ceramic powder, for example $Al_2O_3$ and/or AlN and/or $ZrO_2$ (pure, partly stabilized or fully stabilized) and/or BN and/or BeO, was admixed. In the case of BN, use can be made particularly advantageously of β-BN having a cubic crystal structure. By way of example, diamond powders, silicon carbide powders or boron carbide powders can also be used for admixing. The individual particles of the nonmetallic powder(s) used can have a metallic coating in order that they can be better sintered with the metal powder.

The first metallic layer can be embodied as thick-film metallization. A thick metallic layer makes it possible to reduce mechanical stresses in the assembly in comparison with a thin-film metallization. Advantageously, the first metallic layer can be embodied such that it is at least 50 μm thick. It is thereby possible to avoid cracking in the first nonmetallic layer during the production of the cooler structure.

The first nonmetallic layer can advantageously consist of $Al_2O_3$, SiC, BeO or AlN or some other ceramic material or diamond or comprise one of the materials mentioned. The use of a ceramic having a high thermal conductivity, for example BeO or AlN, can be particularly advantageous. The first nonmetallic layer can be configured as a plate composed of one of the materials mentioned. Other materials such as plastic or nonmetallic composite materials would furthermore be appropriate. A high thermal conductivity can be advantageous in order to be able to dissipate the waste heat from the component. The thickness of the first nonmetallic layer can be for example advantageously between 0.2 mm and 5 mm; by way of example, a standard thickness of 0.25 mm, 0.38 mm, 0.5 mm, 0.63 mm, 1 mm, 2 mm or 5 mm can be used. A sufficiently thick first nonmetallic layer makes it possible to provide a mechanical stability of the composite plate. However, it is also possible to use a thin first nonmetallic layer configured as an electrically insulating layer. The thickness can be between 1 μm and 100 μm, for example. For the mechanical stability of the composite plate, provision can then be made of a different layer, for example first or second metallic layer, having a thickness required for the stability.

The method can likewise advantageously comprise:

g) subdividing the first metallic layer into first regions.

The subdividing can be carried out for example by introducing trenches into the first metallic layer, which trenches can extend as far as the first nonmetallic layer. By way of example, known mask etching methods, mechanical removal methods or laser removal methods can be used for this purpose. The cooler structure can then advantageously be produced on the first regions of the first metallic layer. That can afford the advantage that the coolant flow can then flow directly along the first nonmetallic layer. A possible erosion of the first metallic layer by the coolant can be avoided or reduced as a result. The long-term stability of the flow resistance and heat transfer of the cooler can be improved as a result. Moreover, the first nonmetallic layer can then be cooled directly, as a result of which the heat transfer can be improved. Moreover, subdividing the first metallic layer into first regions makes it possible to avoid or reduce a possible thermomechanically dictated flexure of the composite plate during the method according to the invention or thereafter during operation of the assembly.

The method can likewise advantageously comprise:

h) superficially coating the first and/or the second metallic layer with gold, wherein step h is carried out before step d.

The composite plate can thus be gold-plated. The cooler structure can then be produced directly on the superficial gold layer. Oxidation of the metallic layers can be avoided as a result of the gold layer. That can be advantageous in particular with regard to the technological process reliability.

An optical or optoelectronic assembly according to the invention can be produced by the method according to the invention. The assembly comprises a cooler and an optical or optoelectronic component, wherein the cooler comprises a composite plate, wherein the composite plate comprises at least one first nonmetallic layer and a first metallic layer and a second metallic layer, wherein the second metallic layer is subdivided into a plurality of second regions, wherein the composite plate comprises a start surface on the first metallic layer, b) a cooler structure produced on the start surface by a 3D printing method and composed of a first material comprising a metal, c) a mounting surface for the component, said mounting surface being arranged on the second metallic layer, wherein the component is secured on the mounting surface and the component covers a plurality of second regions of the second metallic layer.

The optical or optoelectronic component can be an optically pumped laser disk, or a diode laser component or a light emitting diode (LED) component.

The diode laser component can comprise a single diode laser bar. The diode laser component can additionally comprise two heat-conducting bodies, between which the laser bar is arranged. Alternatively, the diode laser component can comprise a stack of diode laser elements and heat-conducting bodies. The diode laser elements can be radiation sources configured as laser bars. A laser bar can be configured in a known manner as an edge emitting component and comprise one or preferably a plurality of emitters, which can be arranged in a manner offset with respect to one another in each case in an x-direction. The laser bar can preferably have a width of between 3 mm and 12 mm in the x-direction. It can preferably comprise between 3 and 100 emitters; in particular, laser bars having 5, 7, 19 or 49 emitters are commercially available. The center-to-center distance between adjacent emitters can preferably be between 0.1 mm and 1 mm. The thickness of the laser bar can preferably be between 0.05 mm and 0.2 mm in a z-direction. The resonator length of the emitters of a laser bar in a y-direction can preferably be between 0.5 mm and 6 mm. The direction of the central rays of the emitted laser radiation can be the −y-direction. The directions x, y and z can be at right angles to one another. The laser bar can comprise a known epitaxially produced layer sequence as a p-n junction with a quantum trench. The individual emitters can be configured for example as broad strip emitters or as ridge waveguides. There may also be a plurality of layer sequences with in each case at least one quantum trench, i.e. a plurality of p-n junctions electrically connected in series. Such bars are also referred to as nanostack. A plurality of emitters are then stacked one above another in the z-direction.

A laser bar can be pumped by an electric current. For current input, a first electrical contact pad and a second electrical contact pad can be provided at each laser bar.

The diode laser elements can be arranged parallel in a plurality of xy planes with respect to the coordinate system mentioned above. At least one electrically conductive heat-conducting body can be arranged between in each case two diode laser elements. This makes it possible to ensure that the in each case two diode laser elements mentioned are electrically connected via the heat-conducting body. The stack can comprise a first and a last diode laser element. These are taken to mean the two outer diode laser elements of the stack. A plurality of heat-conducting bodies can be present in the stack. In this case, the stack can be configured such that each heat-conducting body is connected to exactly two laser bars and each laser bar, with the exception of the first and last laser bars, is connected to exactly two heat-conducting bodies. The heat-conducting bodies can advantageously have an extent of 0.2 mm to 5 mm in the z-direction. The stack can furthermore comprise a first and a second contact body. The first contact body can be fitted to the first laser bar. The second contact body can be fitted to the last laser bar. The diode laser elements can be electrically connected in series in the stack. The first and second contact bodies can be provided for the electrical connection of the stack. The operating current of the diode laser elements can flow from the first contact body through the stack to the second contact body. The first contact body can be configured as an anode terminal, and the second contact body as a cathode terminal.

Each heat-conducting body can have a securing surface. The contact bodies possibly provided can also have such a securing surface. The securing surfaces can lie in an xz plane. The securing surfaces of adjacent heat-conducting bodies can be at a first distance from one another. Said first distance can be present in the z-direction. It can substantially correspond to the thickness of the diode laser elements, i.e. the extent thereof in the z-direction. That can mean that the first distance can also be greater than the thickness of the diode laser element by the thickness of joining agent layers. The first distance is necessary in order to avoid a short circuit of diode laser elements. In one preferred embodiment, the heat-conducting bodies can be parallelepipedal. The heat-conducting bodies can be manufactured from silver, copper, molybdenum or tungsten, for example. They can likewise advantageously be manufactured from tungsten-copper, which can be produced by powder metallurgy. It may likewise be advantageous to produce the heat-conducting bodies from a metal-containing composite material, for example silver-diamond, copper-diamond, aluminum-diamond or a metal-graphite composite. Such materials are known from DE 10 2007 051 796 A1 and EP 0 364 155 A2, for example. A metal-containing material which contains carbon nanotubes can likewise be used. A good thermal conductivity and a good electrical conductivity of the material can be advantageous. The heat-conducting bodies can be superficially coated in order to establish good solderability, for example. A known Ni/Au coating can be implemented, for example.

Each heat-conducting body can be secured to at least one region of the second metallic layer. For this purpose, the securing surface of the respective heat-conducting body can be connected to one or more partial surfaces of the mounting surface of the composite plate. Equally, the contact bodies can also be secured to the mounting surface. A plurality of the second regions of the second metallic layer can be separated from one another by trenches, as described above. The laser bars can be arranged in parallel bar planes xy.

In a section perpendicular to the bar plane xy and perpendicular to the composite plate plane xz, a plurality of adjacent trenches can be at a distance from one another which is less than the thickness of the diode laser bars, measured in the z-direction.

The cooler structure can be closed off from the surroundings at the opposite side relative to the composite plate. Thereafter, no coolant can then escape during operation. That may be advantageous if a liquid coolant, for example water, is intended to be used. Alternatively, a coolant structure that is not closed off can also be advantageous. In the case of air cooling, by way of example, the coolant flow can then flow away freely.

The cooler structure can comprise an inner cooler structure. An inner cooler structure can be characterized in that it is surrounded by the coolant. The inner cooler structure can advantageously be configured as a columnar structure. The columns can be configured as cylindrical, frustoconical, in the shape of truncated pyramids, or parallelepipedal, for example. The columns can advantageously have an extent of 0.2 mm to 5 mm in the x- and/or z-direction, respectively. The extent of the inner cooler structure in the y-direction can advantageously be between 0.2 mm and 20 mm. The columns can be arranged regularly in rows (z-direction) and columns (x-direction), for example. A channel structure as inner cooler structure is likewise possible. A plurality of channels can be provided in this case. The channels can each be delimited by walls. One advantage of a columnar structure over a channel structure may be that thermomechanical stresses in the assembly can be reduced. A hood can be slipped over the inner cooler structure, said hood outwardly delimiting the cooler. The hood can have inlet and outlet openings for the coolant. In this case, providing a hood, slipping the hood over the inner cooler structure and securing the hood to the composite plate may also be necessary with regard to the production method.

The cooler structure can comprise an outer cooler structure. An outer cooler structure can be characterized in that it is surrounded by the coolant only on one side and that it closes off the cooler vis-à-vis the environment on the other side. The cooler structure which can comprise an inner and an outer cooler structure can be produced in one method step. The outer cooler structure can comprise an undulatory wall. By comparison with a planar wall that is likewise possible, an undulatory wall can afford the advantage that thermomechanical stresses in the assembly can be reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
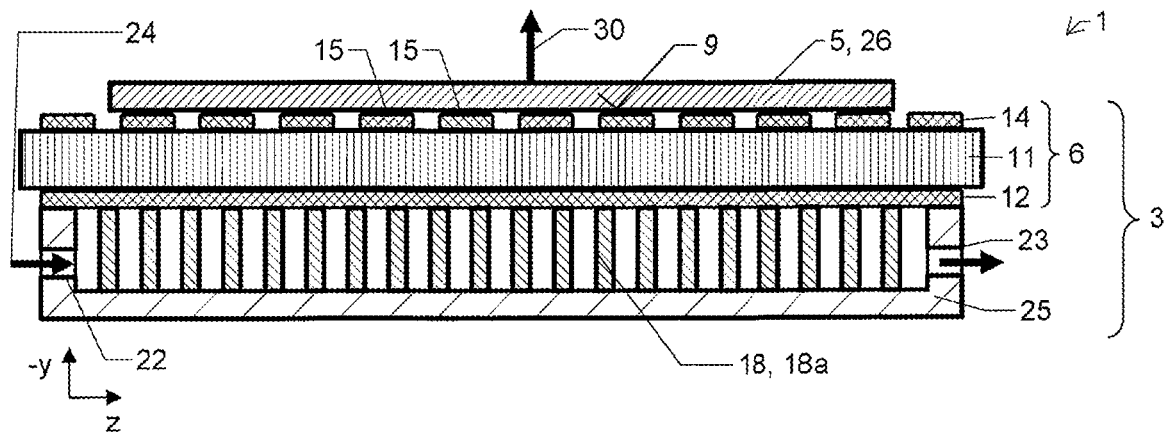
FIG. 1 shows an optical assembly according to the invention of a second exemplary embodiment in a yz section.

FIG. 1 shows a second exemplary embodiment of an optical assembly 1 in a yz section. The assembly comprises a cooler 3 and an optical component 5, which is present as a laser disk 26. During operation, a laser radiation 30 is emitted in the −y direction. In order to dissipate the waste heat from the laser disk 26, a coolant flow 24 is used. Water, for example, is considered as coolant. The cooler 3 comprises a composite plate 6, a cooler structure 18, which is present here as an inner cooler structure 18a, and also a hood 25, which delimits the coolant flow from the surroundings. A coolant inlet 22 and a coolant outlet 23 are incorporated into the hood 25. The composite plate 6 comprises a first nonmetallic layer 11, a first metallic layer 12 and a second metallic layer 14, which is subdivided into a plurality of second regions 15. The second metallic layer 14 has a mounting surface 9, to which the laser disk 26 is secured. In this case, the laser disk 26 covers a plurality of second regions 15.

Figure 2:
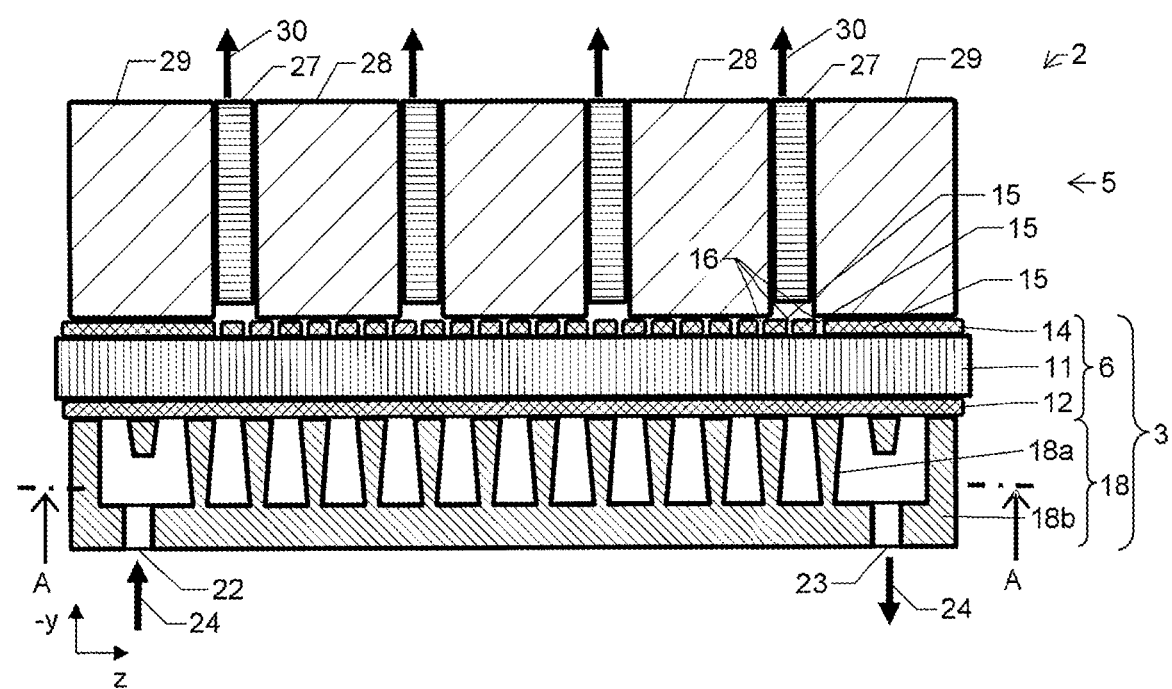
FIG. 2 shows an optoelectronic assembly according to the invention of a third exemplary embodiment in a yz section.

FIG. 2 shows a third exemplary embodiment of an optoelectronic assembly 2 in a yz section. The assembly comprises a cooler 3 and an optoelectronic component 5, which is present as a diode laser component. The diode laser component comprises a stack of laser bars 27 and heat-conducting bodies 28, which stack is closed off at both ends by a respective contact body 29. During operation, the laser bars 27 emit laser radiation 30 in the −y direction. In order to dissipate the waste heat, a coolant flow 24 is used. Water, for example, is considered as coolant. The cooler 3 comprises a composite plate 6, a cooler structure 18, which is present here as inner cooler structure 18a and outer cooler structure 18b. The outer cooler structure 18b delimits the coolant flow from the surroundings. A coolant inlet 22 and a coolant outlet 23 are incorporated into the outer cooler structure 18b. The composite plate 6 comprises a first nonmetallic layer 11, a first metallic layer 12 and a second metallic layer 14, which is subdivided into a plurality of second regions 15. The second regions 15 are separated from one another by trenches 16. The trenches 16 prevent adjacent heat-conducting bodies 28 and/or contact bodies 29 from being electrically short-circuited via the second metallic layer 14. The optoelectronic component 5 covers a plurality of second regions 15. The position of a sectional plane AA through the cooler 3 is furthermore indicated.

Figure 3:
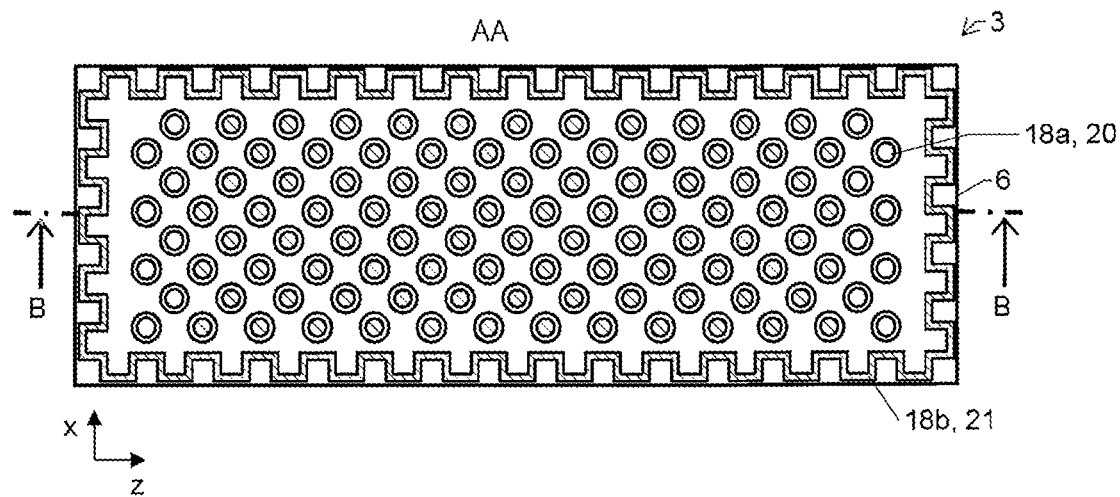
FIG. 3 shows the assembly according to the invention of the third exemplary embodiment in an xz section along a sectional plane AA through the cooling structure.

FIG. 3 shows the assembly according to the invention of the third exemplary embodiment in an xz section along the sectional plane AA through the cooler 3. The inner cooler structure 18a is configured as a columnar structure 20. The columns are configured in the shape of truncated circular cones. The outer cooler structure 18b is likewise illustrated, said outer cooler structure being configured as an undulatory wall 21.

Figure 4:
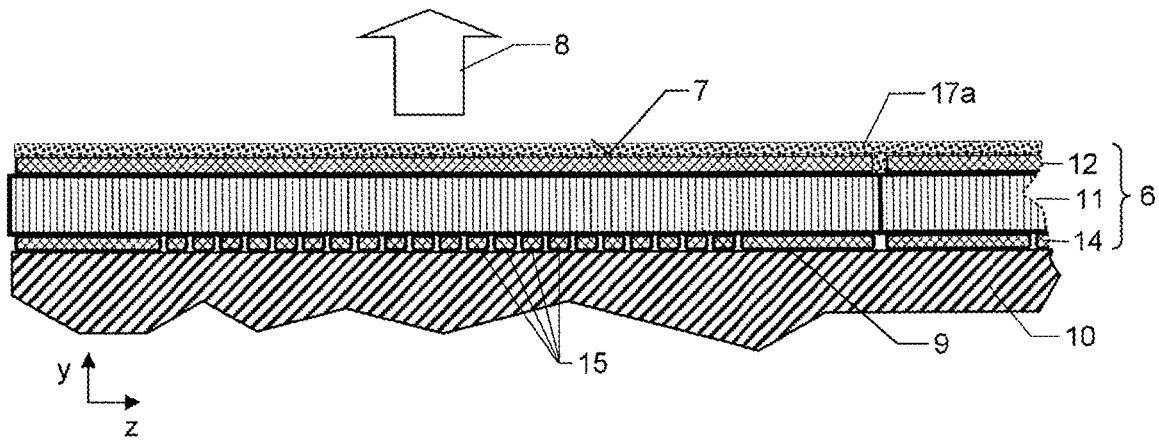
FIG. 4 shows a step of a first exemplary embodiment of the method according to the invention.

FIG. 4 shows a step of a first exemplary embodiment of the method according to the invention. The composite plate 6 is secured on the carrier 10 by the mounting surface 9 during the production of the cooler structure. The second metallic layer 14 has already been subdivided into second regions 15 beforehand. The exemplary embodiment shows that a plurality of coolers can be produced simultaneously. A first material as powder 17a is applied on the start surface 7 situated at the top of the first metallic layer 12. The applying is carried out in a known manner as a layer having a predetermined thickness.

Figure 5:
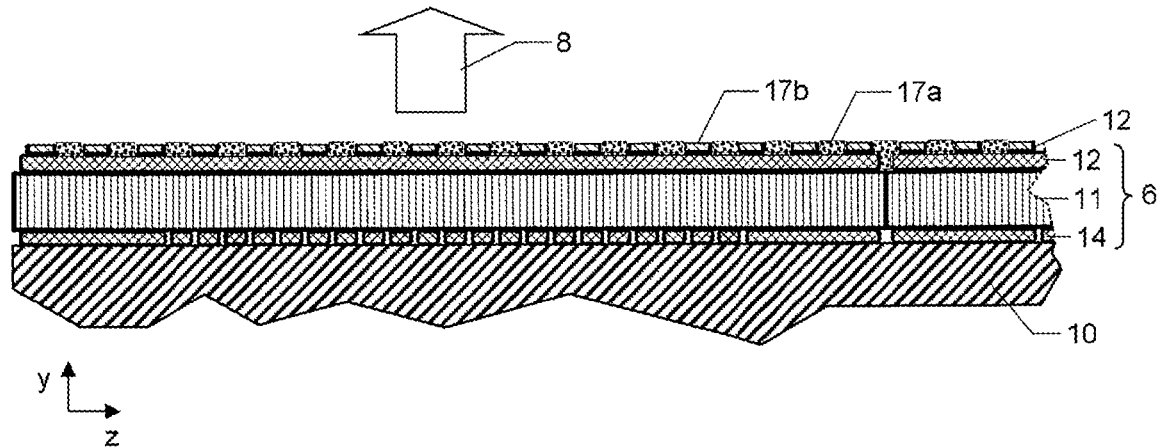
FIG. 5 shows a further step of the first exemplary embodiment of the method according to the invention.

FIG. 5 shows a further step of the first exemplary embodiment of the method according to the invention. The first material 17 is sintered or melted at predetermined locations by means of a laser beam. In this case, during solidification, the powder particles bond together and with the underlying first metallic layer 12. Afterward, first material in consolidated form 17b is present at the laser-processed locations, while first material as powder 17a remains at the locations that have not been subjected to laser treatment. It is then possible progressively for further layers of the first material in powder form to be applied and consolidated in places. As a result, the cooler structure can be produced layer by layer in a growth direction 8.

Figure 6:
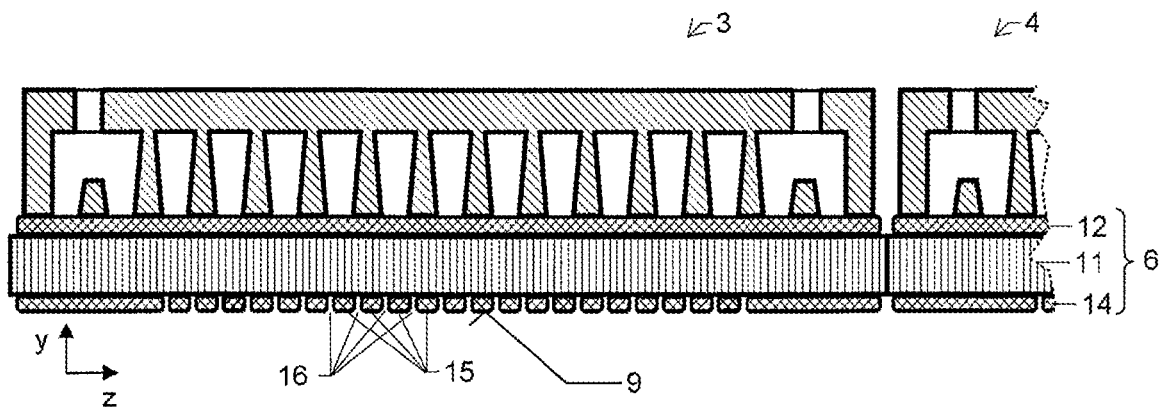
FIG. 6 shows two completed coolers of the first exemplary embodiment of the method according to the invention.

FIG. 6 shows two completed coolers of the first exemplary embodiment of the method according to the invention. Alongside the cooler 3, a further cooler 4 has been produced in the same work process. It is possible to provide a composite plate 6 (may also be referred to as panel) of appropriate size in order to produce a large number of coolers simultaneously. The latter are then singulated by the first nonmetallic layer 11 being severed at predetermined locations between the individual coolers. Moreover, it is possible to produce not just the coolers but the entire assembly in the panel and to singulate the assemblies only after the components have been secured. The separation of the second regions 15 by trenches 16 can also be discerned in FIG. 6. As a result, the mounting surface 9 is also divided into partial surfaces. In the mathematical sense, the mounting surface is not a contiguous surface.

Figure 7:
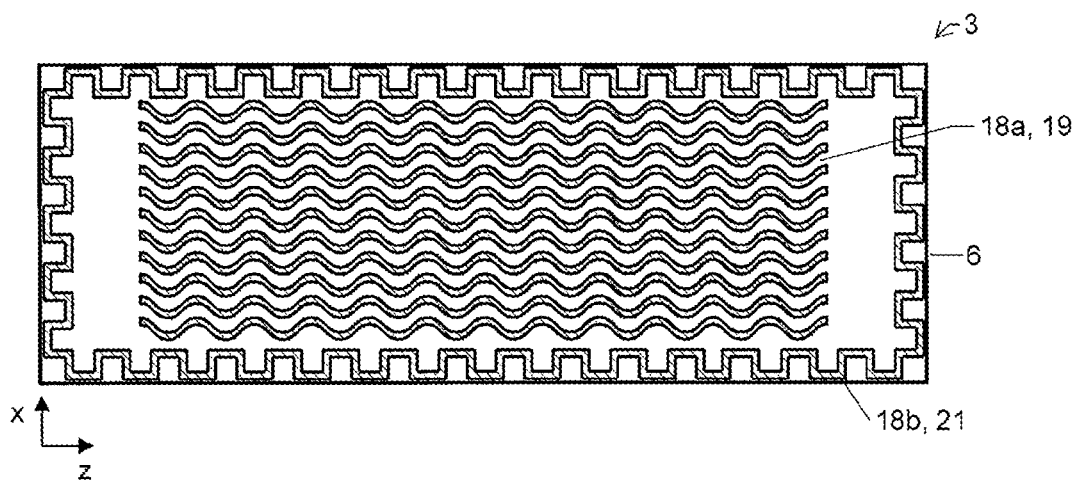
FIG. 7 shows an assembly according to the invention of a fourth exemplary embodiment in an xz section along a sectional plane through the cooling structure.

FIG. 7 shows an assembly according to the invention of a fourth exemplary embodiment in an xz section along a sectional plane through the cooling structure. Here the inner cooler structure 18a comprises a plurality of cooling channels 19 delimited by undulatory walls.

Figure 8:
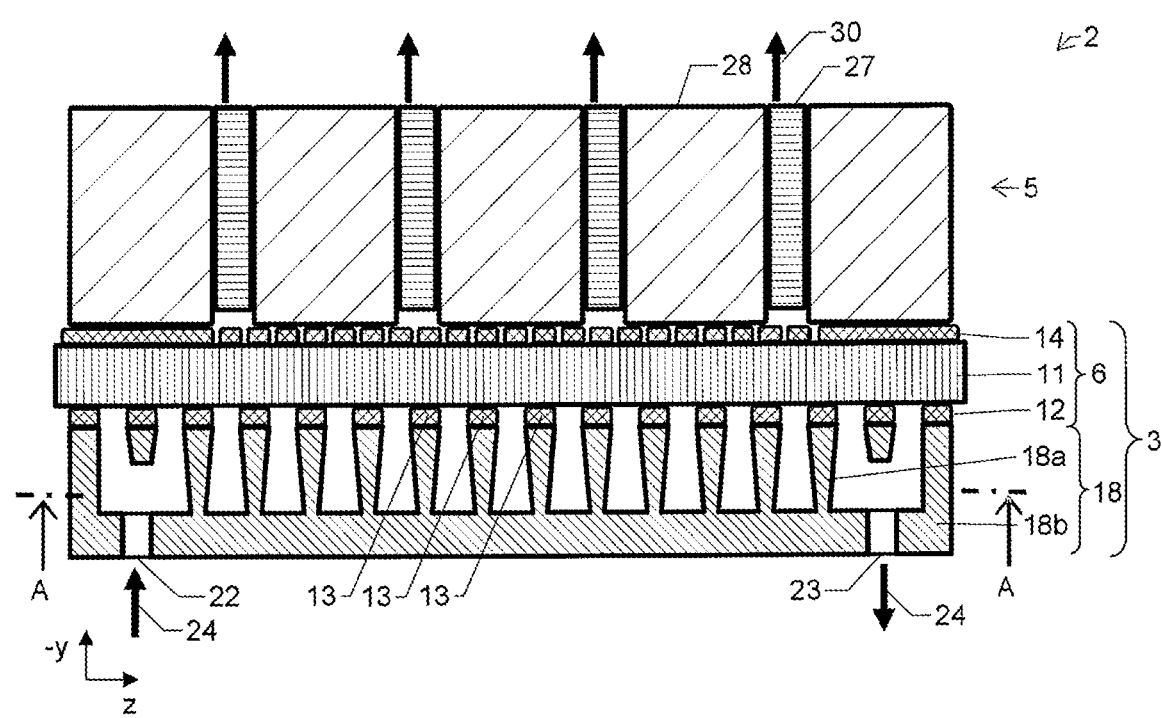
FIG. 8 shows an optoelectronic assembly according to the invention of a fifth exemplary embodiment in a yz section.

FIG. 8 shows an optoelectronic assembly according to the invention of a fifth exemplary embodiment in a yz section.

The first metallic layer 12 is subdivided into first regions 13. As a result, the coolant can flow along the first nonmetallic layer 11 in places.

For the sake of completeness, it should be pointed out that the figures are not drawn to scale.

The invention being thus described, it will be obvious that the same may be varied in many ways. Such variations are not to be regarded as a departure from the spirit and scope of the invention, and all such modifications as would be obvious to one skilled in the art are to be included within the scope of the following claims

What is claimed is:

1. A method for producing an optical or optoelectronic assembly, comprising
    a) providing a composite plate, wherein the composite plate comprises at least one first nonmetallic layer and a first metallic layer and a second metallic layer,
    b) subdividing the second metallic layer into a plurality of second regions,
    c) providing a start surface on the first metallic layer,
    d) producing a cooler structure on the start surface by selectively melting and/or by selectively sintering at least one first material,
    e) providing an optical or optoelectronic component, wherein the component comprises at least one optically pumped laser disk or at least one diode laser bar or at least one light emitting diode (LED),
    f) securing the component on a mounting surface arranged on the second metallic layer, wherein securing the component is carried out after producing the cooler structure and the component covers a plurality of second regions of the second metallic layer.

2. The method as claimed in claim 1, wherein producing the cooler structure involves supplying the first material in powder form and carrying out the selective melting and/or the selective sintering layer by layer in a growth direction.

3. The method as claimed in claim 1, wherein the first material is Ag, Cu, Al, Ni, Cr, Mo, W or some other metal or comprises one of these metals and/or the first metallic layer consists of Cu, Ag, Ni, Au or Al or comprises one of the substances mentioned.

4. The method as claimed in claim 1, wherein the first metallic layer is at least 50 μm thick.

5. The method as claimed in claim 1, wherein the first nonmetallic layer consists of $Al_2O_3$, SiC, BeO or AlN or some other ceramic material or diamond or in that the first nonmetallic layer comprises one of the materials mentioned.

6. The method as claimed in claim 1, additionally comprising
    g) subdividing the first metallic layer into first regions, wherein the cooler structure is produced on the first regions of the first metallic layer.

7. The method as claimed in claim 1, additionally comprising
    h) superficially coating the first and/or the second metallic layer with gold, wherein step h is carried out before step d.

8. An optical or optoelectronic assembly comprising a cooler and an optical or optoelectronic component, wherein the cooler comprises
    a) a composite plate, wherein the composite plate comprises at least one first nonmetallic layer and a first metallic layer and a second metallic layer, wherein the second metallic layer is subdivided into a plurality of second regions,
    b) wherein the composite plate comprises a start surface on the first metallic layer, c) a cooler structure produced on the start surface by a 3D printing method and composed of a first material comprising a metal,
d) a mounting surface for the component, said mounting surface being arranged on the second metallic layer,
e) wherein the component is secured on the mounting surface and the component covers a plurality of second regions of the second metallic layer.

9. The optical or optoelectronic assembly as claimed in claim 8, wherein the optical or optoelectronic component is an optically pumped laser disk, or a diode laser component or a light emitting diode (LED) component.

10. The optical or optoelectronic assembly as claimed in claim 9, wherein the diode laser component comprises a single diode laser bar or comprises a stack of diode laser bars and heat-conducting bodies, wherein at least one heat-conducting body is arranged respectively between two laser bars, and each heat-conducting body is secured to at least one second region.

11. The optical or optoelectronic assembly as claimed in claim 10, wherein a plurality of the second regions of the second metallic layer are separated from one another by trenches, wherein a plurality of adjacent trenches are at a distance from one another which is less than a thickness of the diode laser bars.

12. The optical or optoelectronic assembly as claimed in claim 8, wherein the cooler structure is closed off from the surroundings at the opposite side relative to the composite plate.

13. The optical or optoelectronic assembly as claimed in claim 8, wherein in that the cooler structure comprises an inner cooler structure configured as a columnar structure.

14. The optical or optoelectronic assembly as claimed in claim 8, wherein the cooler structure comprises an inner cooler structure, over which a hood is slipped, which outwardly delimits the cooler.

15. The optical or optoelectronic assembly as claimed in claim 8, wherein the cooler structure comprises an outer cooler structure configured as an undulatory wall.

* * * * *